United States Patent [19]

Abele

[11] 4,346,162
[45] Aug. 24, 1982

[54] NEGATIVE TONABLE PHOTOSENSITIVE REPRODUCTION ELEMENTS

[75] Inventor: Werner Abele, Neu-Isenburg, Fed. Rep. of Germany

[73] Assignee: E. I. Du Pont de Nemours and Company, Wilmington, Del.

[21] Appl. No.: 274,559

[22] Filed: Jun. 17, 1981

[30] Foreign Application Priority Data

Jun. 21, 1980 [DE] Fed. Rep. of Germany ....... 3023247

[51] Int. Cl.³ ................................................ G03C 1/68
[52] U.S. Cl. ................................... 430/270; 430/271; 430/905; 430/919; 430/920
[58] Field of Search ............... 430/269, 270, 281, 919, 430/920, 271, 904

[56] References Cited

U.S. PATENT DOCUMENTS

| | | | |
|---|---|---|---|
| 3,479,185 | 11/1969 | Chabbers | 430/281 |
| 3,615,454 | 10/1971 | Cescon et al. | 430/270 |
| 3,652,275 | 3/1972 | Baum et al. | 430/269 |
| 4,243,741 | 1/1981 | Abele et al. | 430/270 |
| 4,271,260 | 6/1981 | Abele et al. | 430/270 |

*Primary Examiner*—Jack P. Brammer

[57] ABSTRACT

A nonsilver photosensitive reproduction element for preparing negative tonable images which comprises a support bearing a layer of a photosensitive composition which comprises at least one thermoplastic binder, at least one thio compound of the formula:

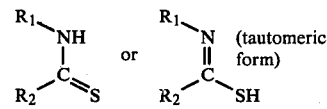

wherein $R_1$ and $R_2$ are as defined, and at least one hexaarylbisimidazole compound as defined. Optionally plasticizers, stabilizers, etc. can be present in the photosensitive layer. The photosensitive element is useful in preparing negative tonable images.

4 Claims, No Drawings

NEGATIVE TONABLE PHOTOSENSITIVE REPRODUCTION ELEMENTS

TECHNICAL FIELD

This invention relates to new photosensitive nonsilver elements, and more particularly to negative-working photosensitive elements.

BACKGROUND ART

Photosensitive layers are useful in photosensitive reproduction elements in which differences in tackiness between the exposed and unexposed areas of the photosensitive layer are used to produce the image.

Image reproduction processes are known from German Pat. Nos. 1,904,058, 1,904,059, 1,210,321, and 2,004,214, in which tacky, photopolymerizable reproduction elements are hardened by imagewise exposure, i.e., the exposed areas of the image lose their tackiness. The photopolymerizable reproduction elements comprise a support film and a photopolymerizable layer, which contains at least one addition polymerizable monomer and a photopolymerization initiator.

Combinations of hexaarylbisimidazoles and mercapto compounds are described as initiator systems for the initiation of photopolymerization in, for example, German Pat. Nos. 1,904,058 and 2,004,214, as well as in U.S. Pat. No. 3,479,185. The hexaarylbisimidazole upon exposure is split into two free radicals, which react with the mercapto compounds so that new radicals are formed, which in turn initiate addition polymerization.

The effectiveness of the initiator system in terms of the sensitivity of the photosensitive layer is substantially increased by the mercapto compounds. The concentration of hexaarylbismidazole compound in such photopolymerizable reproduction elements generally amounts to 1.5 to 4.5% by weight, the concentration of the mercaptocoinitiator amounts to 0.2 to 2.5% by weight based on the total solid content of the photosensitive layer. An increase in this concentration, as stated in U.S. Pat. No. 3,479,185, does not lead to a further increase of sensitivity, but in some instances even leads to a regression of sensitivity.

The latent image areas of varied tackiness formed after exposure are made visible by the application of suitable colored toners, which only adhere to the unexposed tacky areas. The toners are easily removed from the exposed nontacky areas. Positive images of the original are obtained according to these known processes which have attained considerable importance for carrying out color proof processes in reproduction technology.

An element is known from Abele and Grossa U.S. Pat. No. 4,243,741, which is not based on photopolymerization and in which the unexposed areas are nontacky. The exposed areas upon imagewise exposure become tacky and can be made visible using a suitable toner thereby forming a negative image. This element utilizes a dihydropyridine compound and a hexaarylbisimidazole compound.

The inherent yellow color of the dihydropyridines is disadvantageous with this element and limits the use of the element for color proofing purposes. The inherent yellow color of the layers is enhanced proportionately to the number of layers employed in the preparation of multilayer, multicolor images, so that the background (nontoned) areas do not exhibit the desired freedom from unwanted yellow coloration.

An object of this invention is to provide a photosensitive reproduction element for the preparation of negative tonable images which avoids the disadvantage of yellowing.

DISCLOSURE OF THE INVENTION

In accordance with this invention there is provided a photosensitive nonsilver reproduction element comprising a support bearing a layer of a photosensitive composition which comprises at least (1) one thermoplastic binder, (2) a photosensitive system consisting essentially of (a) 10 to 50% by weight, based on the total weight of solids in the photosensitive composition, of at least one thio compound of the formula:

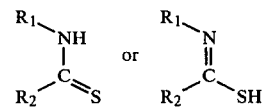

wherein $R_1$ can be H, alkyl of 1 to 4 carbon atoms and aryl of 6 to 10 carbon atoms, and $R_2$ can be H and alkyl of 1 to 6 carbon atoms, and $R_1$ and $R_2$ when taken together can be members of a 5 to 7 membered ring which may contain oxygen, sulfur and nitrogen as additional heteroatoms, and (b) at least one hexarylbisimidazole compound of the formula:

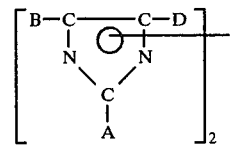

wherein A, B and D are either identical or different and are optionally substituted aryl groups derived from carbocyclic or heterocyclic compounds; and optionally (3) a plasticizer.

The thio compound must be present in the photosensitive composition in at least 10%, preferably 15 to 30% by weight based on the total weight of solids in the photosensitive composition. Hexaarylbisimidazoles can be present in concentrations of 10 to 70%, preferably from 30 to 50% present by weight, based on the total weight of solids in the photosensitive composition. Using the defined thioamides and thiolactams and/or their tautomeric mercapto compounds, photosensitive layers can be prepared which when exposed to actinic light a tackiness and thus a tonability are produced. In contrast to known dihydropyridines the thio compounds excel in that they do not have any disturbing inherent coloration. This makes possible the preparation of multicolored proof prints by multiple lamination on the same receiving elements, successive lamina being appropriately exposed and then toned with different colored toners or dyes, without encountering an undesirable, mostly yellowish discoloration of the nontoned background image areas.

The effectiveness of the thio compounds of the invention is surprising insofar as the use of larger amounts of mercapto compounds in photopolymerizable materials has proven to be disadvantageous, as disclosed, for example, in U.S. Pat. No. 3,479,185. There is also no correlation between the effectiveness of mercapto compounds as coinitiators in photopolymerizable materials and their usefulness in the photosensitive elements of this invention. Thus, for example, 2-mercaptobenzimidazoles and 2-mercaptobenzthiazoles described as very good coinitiators in U.S. Pat. No. 3,479,185 are unsuitable for the purpose of the invention, while 2-mercaptothiazoline, only moderately effective as coinitiator, has proven to be especially well suited.

Examples of useful thio compounds are summarized in Tables 1 and 2 below. Useful $R_1$ substituents include H, alkyl, e.g., $CH_3$, $C_2H_5$, $C_3H_7$, $C_4H_9$; aryl, e.g., phenyl ($6_6H_5$), naphthyl ($C_{10}H_7$) and substituents thereof.

TABLE 1

(Thioamides)

| Compound | —$R_1$ | $R_2$ |
|---|---|---|
| 1/1 | —H | —H |
| 1/2 | —H | —$CH_3$ |
| 1/3 | —$CH_3$ | —H |
| 1/4 | —$CH_3$ | —$CH_3$ |
| 1/5 | —$C_6H_5$ | —H |
| 1/6 | —$C_6H_5$ | —$CH_3$ |
| 1/7 | —$C_6H_5$ | —$C_2H_5$ |
| 1/8 | —$C_6H_5$ | $C_4H_9$ |
| 1/9 | —$C_6H_4Cl$ | —$CH_3$ |
| 1/10 | —$C_6H_4Cl$ | —$C_4H_9$ |
| 1/11 | —$C_6H_4$—$CH_3$ | —$C_4H_9$ |
| 1/12 | —$C_6H_4$—O—$CH_3$ | —$CH_3$ |
| 1/13 | —$C_6H_4$—O—$CH_3$ | —$C_2H_5$ |
| 1/14 | —$C_6H_4$—O—$C_2H_5$ | —$CH_3$ |
| 1/15 | —$C_6H_4$—O—$C_2H_5$ | —$C_2H_5$ |
| 1/16 | —$C_6H_4$—O—$CH_3$ | —$C_4H_9$ |

TABLE 2

Thiolactams and/or Tautomeric Mercapto Compounds

| Compound | —$R_1$—$R_2$— |
|---|---|
| 2/1 | —$CH_2$—$CH_2$—$CH_2$— |
| 2/2 | —$CH_2$—$CH_2$—S— |
| 2/3 | —$CH(CH_3)$—$CH_2$—S— |
| 2/4 | —$CH_2$—$CH(CH_3)$—S— |
| 2/5 | —$C(CH_3)_2$—$CH_2$—S— |
| 2/6 | —$CH_2$—$C(CH_3)_2$—S— |
| 2/7 | —$CH_2$—$CH_2$—O— |
| 2/8 | —$CH(CH_3)$—$CH_2$—O— |
| 2/9 | —$C(CH_3)_2$—$CH_2$—O— |
| 2/10 | —CH=CH—$N(CH_3)$— |
| 2/11 | —$CH_2$—$CH_2$—$CH_2$—S— |
| 2/12 | —$CH_2$—$CH_2$—$CH(CH_3)$—S— |
| 2/13 | —$CH_2$—$CH_2$—$CH_2$—O— |
| 2/14 | —$CH_2$—$CH_2$—$CH_2$—$CH_2$—$CH_2$— |
| 2/15 | —$C_6H_4$—O— |

1/5, 1/7, 1/14, 2/1, 2/2, and 2/14 are the especially preferred compounds. Individual compounds as well as their mixtures can be used.

Some thioamides, thiolactams, and/or their tautomeric mercapto compounds are commercially available products. Where this is not the case, they can be obtained either by reaction of analogous acid amides with phosphorous pentasulfide, e.g., according to directions given in Berichten der Deutschen Chemischen Gesellschaft 22 (1889), page 906, or the Annalen der Chemie 407 (1915), page 407, or they can be prepared according to other processes described in the literature, e.g., according to the Berichten der Deutschen Chemischen Gesellschaft 36 (1903), page 1281.

Hexaarylbisimidazole compounds according to the invention are described in German Patent 1,300,013 incorporated by reference. Of the compounds disclosed therein the hexaarylbisimidazoles listed in Table 3 have proven to be especially suitable.

TABLE 3

| Compound No. | A | B | C |
|---|---|---|---|
| 3/1 | —Phenyl | —Phenyl | —Phenyl |
| 3/2 | —Chlorophenyl | —Phenyl | —Phenyl |
| 3/3 | —2-chlorophenyl | -3-methoxyphenyl | -3-methoxyphenyl |
| 3/4 | -2-ethoxyphenyl | —Phenyl | —Phenyl |
| 3/5 | -2-methoxyphenyl | —Phenyl | —Phenyl |

Two or more hexaarylbisimidazole compounds can be advantageously used together.

Binders useful within the scope of the invention can be selected from the group of thermoplastic polymers:

Polyacrylic acid- and/or methacrylic acid, as well as mixed polymers with acrylic- and/or methacrylic acid or other acrylic- and/or vinyl monomers, chlorine containing vinyl polymers and/or mixed polymers, e.g., polyvinyl chloride, as well as the afterchlorination products, polyvinylidine chloride, chlorinated polyethylene, etc., Polystyrene and polystyrene mixed polymers, Ethylene and ethylene mixed polymers, e.g., with maleic acid, etc., Synthetic rubber varieties based on butadiene, chloroprene, etc. and their mixed polymers, e.g., with styrene, acrylonitrile, etc., Polyether, e.g., high-molecular polyethylene oxides or polyepichlorohydrin, etc.

Plasticizers can optionally be added to these binders. Especially useful are:

Glycol esters or glycol ethers, e.g., triethylene glycol diacetate, ethylene glycol dibutyrate, etc., Phthalic acid esters, e.g., dioctyl phthalate, etc., Phosphoric acid esters, e.g., tricresyl phosphate, trioctyl phosphate, etc., Ester aliphatic dicarboxylic acids, e.g., esters of adipic acid such as dibutyl adipate, etc.

The polymeric binder can be present in the photosensitive compositions in amounts from 10 to 80% by weight based on the total dry weight of the composition. The amount of plasticizer conforms to the binder used and should be measured so that the unexposed layer is not yet tacky. The changes in tackiness brought about by imagewise exposure, however, suffice to produce a total tackiness sufficient to hold the toner to the exposed areas. Amounts from 0% to 40% by weight plasticizer, based on the total dry weight of the composition, have proven to be suitable.

To improve storage stability, sterically hindered phenols are used, e.g., 2,6-di-tert.-butyl phenol, 2,4,6-tritert.-butyl phenol, or [2,2'-methylene-bis (4-ethyl-6-tert.-butyl phenol)]. Admixture is in amounts of 0.5 to 5%, preferably 1.5 to 3% by weight based on the total weight of solids in the photosensitive composition.

In addition to the above ingredients, the photosensitive composition of the invention optionally can contain other known additives, e.g., sensitizers, optical brighteners, matting agents, wetting agents, etc. Among others, benzophenone or Michler's ketone have proven to be especially useful as sensitizers.

A large number of transparent or opaque materials are useful as supports for the photosensitive layers. Examples are: papers, optionally barited; cardboard, metal films, e.g., aluminum, copper, steel, etc.; wood, glass, films, or fiber webs of natural or synthetic polymers, e.g., polyamides, elastomers, polyethylene or -propylene, linear polyester, e.g., polyethylene terephthalate; cellulose, cellulose esters, polyvinyl chloride or their mixed polymers, polyacrylonitrile, etc. If necessary, additional layers, for example, an antihalation layer can be applied to the support.

A special protective film over the photosensitive layer, which must be removed before the toning process, is not necessary. It can, however, be applied to avoid damage of the photosensitive layer.

Ingredients of the photosensitive layer are applied generally as solutions in volatile solvents according to known methods and subsequently are dried. Suitable solvents include: methylene chloride, acetic acid ethyl ester; acetone, etc. The concentration of the nonvolatile ingredients of the coating solution can vary within wide limits. The concentration depends on the coating process and the desired layer thickness. Other processes of application, without the use of solvents, are useful such as calendering, extrusion, etc.

Dye powders of the most varied composition can be used for toning the exposed layer. Suitable toners are inorganic or organic pigments and soluble organic dyes. The individual dye particles can be provided with a shell made of a suitable polymeric material to improve handling. Suitable toners are disclosed for example, in German Pat. No. 1,210,321, and U.S. Pat. Nos. 3,620,726, 3,649,268, and 3,909,282.

The toning is carried out either by hand or with the help of a cotton pad or special applicator. The image thus can be directly produced on the support material bearing the exposed photosensitive layer. If desired, this image can be transferred by lamination to another material or substrate. According to another embodiment, the photosensitive layer is transferred to the final support before exposure and is exposed and toned there. Depending on the choice of the support material, prints as well as transparencies can be produced.

To prepare multicolor images, several images toned in single colors are mounted or laminated on top of each other, or several exposures of the same layer are made using different originals and are individually toned by application of different colored dye toners. The exposure of the layer is by means of an ultraviolet light or radiation source. Preferred is a wavelength range from 300–400 nm. The necessary exposure times, depending on sensitivity of the photosensitive film, type, intensity, and distance of the light source used, are between 10 and 200 seconds.

Moreover, the photosensitive reproduction element of the invention has the same advantageous properties as were described for a negative tonable system in U.S. Pat. No. 4,243,741; thus, no screened relief images are necessary to produce halftone images. Even non-screened halftone images can be reproduced with comparable gradation. It is also possible in case of underexposure to raise the density of the toned image by postexposure and post-toning. Additionally, the element of the invention, in contrast to photopolymer elements, is not oxygen-sensitive, so that measures are not required to exclude oxygen, e.g., special oxygen impermeable protective films or protective layers, or conditioning of the element in nitrogen or other inert gases.

INDUSTRIAL APPLICABILITY

The photosenstive elements are useful for the reproduction of negative images in many applications, e.g., direct color separation technology, single and multicolor images from masters, etc.

EXAMPLES

The preparation and use of the elements of the invention is described in the following examples:

EXAMPLE 1

In 100 ml each of methylene chloride are successively dissolved while stirring:

| | | |
|---|---|---|
| (a) | 2.0 g | DEGALAN ® (ethylacrylate copolymer of Degussa) |
| | 3.0 g | hexaarylbisimidazole compound, 3/2 |
| | 1.5 g | 1,4-dihydro-2,4,6-trimethyl-3,5-dicarbethoxy pyridine |
| (b) | 2.0 g | DEGALAN ® copolymer as described above in (a) |
| | 3.0 g | hexaarylbisimidazole compound, 3/2 |
| | 1.5 g | thiopropionyl anilide, 1/7. |

Solutions (a) and (b) are coated separately onto a barite-treated paper support and are dried. Both samples are exposed for 40 seconds through a screen negative image using a 1000 W UV light source at a distance of about 60 cm. Subsequently, the layers are toned with a black pigment using a cotton pad. The toner adheres only to the exposed areas. The nonadhering toner is removed with a fresh cotton pad. Black and white positives of the negative are obtained. While sample (a) indicates a light yellowing of the unexposed areas, sample (b) excels by having a pure white background.

EXAMPLE 2

In 100 ml each of methylene chloride are dissolved while stirring:

| | | |
|---|---|---|
| (a) | 1.5 g | methacrylic acid ethyl ester-methacrylic acid copolymer (9:1), No. average molecular weight 30,000–40,000 |
| | 0.5 g | polyglycol hexadecyl ether |
| | 2.5 g | 1,4-dihydro-2,4,6-trimethyl-3,5-dicarbethoxy pyridine |
| | 2.5 g | 1,4-dihydro-2,6-dimethyl-4-ethyl-3,5-dicarbethoxy pyridine |
| | 0.8 g | hexaarylbisimidazole compound, 3/1 |
| | 2.0 g | hexaaryl bisimidazole compound, 3/5 |
| | 0.3 g | benzophenone |
| (b) | 1.5 g | methacrylic acid ethyl ester-methacrylic acid copolymer (9:1), No. average molecular weight 30,000–40,000 |
| | 0.5 g | polyglycol hexadecyl ether |
| | 2.5 g | thiopropionyl-p-ethoxyanilide, 1/15 |
| | 2.5 g | Ω-thiocaprolactam, 2/14 |
| | 0.8 g | hexaarylbisimidazole compound, 3/1 |
| | 2.0 g | hexaarylbisimidazole compound, 3/5 |
| | 0.3 g | benzophenone. |

Solutions (a) and (b) are coated separately onto polypropylene supports and are dried. The photosensitive layers are transferred under pressure and heat onto barite-treated paper supports. The elements formed are exposed in contact with a screen negative yellow separation of a colored relief image to a 1000 W UV lamp, at a distance of 60 cm, for 60 seconds. Subsequently, the exposed layers are toned with a yellow pigment as described in Example 1. Negative yellow prints used for color separation are obtained.

A second photosensitive layer of the described composition is transferred onto each of these images, is exposed through a negative magenta separation, and is toned with a magenta toner. A negative magenta image over a yellow image is obtained. Finally, this procedure is repeated with a cyan separation and a cyan toner. As a result of the above step, negative (tri)color print are obtained in relation to the color separation used, and a positive (tri)color print in relation to the original image. While sample (a) indicates a clear yellow discoloration of the nontoned areas, sample (b) excels by having a pure white background.

EXAMPLE 3

In 100 ml methylene chloride are successively dissolved while stirring:

1.0 g PLEXIGUM® MB 319 (methylmethacrylate/ethylacrylate copolymer of Rhoem, reduced viscosity/viscosity number, 0.5 to 0.6 deciliters/gram)
0.5 g PALAMOLL® 632 (polyester from adipic acid and propane-1,2-diol of BASF, dynamic viscosity 2.0 to 3.5 Pascal-seconds at 20° C.)
2.5 g hexaarylbisimidazole compound, 3/4
1.0 g thioaceto-p-ethoxyaniline, 1/14
0.2 g tri-tert.-butyl phenol This solution is coated onto a polypropylene support. After drying the photosensitive layer is transferred as in Example 2 by pressure and printing onto a barite-treated paper support, is exposed behind a screen color separation negative, and is toned. A (tri)color print on a white background is obtained.

EXAMPLE 4

In 100 ml methylene chloride are dissolved while stirring:

6.0 g of a copolymer of 55 mol-% acrylic acid ethyl ester, 40 mol-% methacrylic acid methyl ester, and 5 mol % acrylic acid with No. average molecular weight of 260,000,
1.0 g of the same copolymer with a No. average molecular weight of 7,000,
1.0 g 5-methyl-2-mercaptothiazoline, 2/14
2.0 g hexaarylbisimidazole compound, 3/5.

The solution is coated onto a polypropylene support and is dried. The photosensitive layer is transferred by pressure and heat onto a barite-treated paper support.

Exposure, lamination of additional photosensitive layers and toning is accomplished as described in Example 2. A negative (tri)color print in relation to the color separations and a positive (tri)color print in relation to the original image is also obtained with a clear white background in the nontoned areas.

EXAMPLE 5

In 100 ml methylene chloride are dissolved:
2.5 g poly(n-butylmethacrylate)
2.5 g hexaarylbisimidazole compound, 3/3
1.0 g 2-mercaptothiazoline, 2/2.

The solution is divided into solution (a) and solution (b). Solution (a) is coated onto a white pigmented polyester support and solution (b) onto a barite-treated paper support and are dried. Exposure and toning take place with both samples as described in Example 1. Black and white prints, which are negative to the image used and positive to the original and have a pure white toning of the nonexposed, nontoned areas, are obtained.

EXAMPLE 6

In 100 ml methylene chloride are dissolved:
2.0 g of the polymeric binder described in Example 1
2.0 g each of hexaarylbisimidazole compounds, 3/3 and 3/4
2.0 g thiopropionyl anilide, 1/7
1.0 g 2-thiopyrrolidone, 2/1
1.0 g 2-mercaptooxazoline, 2/7.

The solution is coated onto a transparent polyester support and is dried. After exposure and toning as described in Example 1, a black and white transparency is obtained.

EXAMPLE 7

In 100 ml methylene chloride are successively dissolved while stirring:
1.0 g polyepichlorohydrin
0.4 g triphenyl phosphate
2.5 g hexaarylbisimidazole compound, 3/3
1.0 g thioformanilide, 1/5.

The solution is coated onto a polypropylene support and is dired. The photosensitive layer thus formed is transferred to a barite-treated paper support using pressure and heat and is exposed for 60 seconds in contact with a halftone negative image using a 1000 W UV light source at a distance of 60 cm. Subsequently, the layer is toned with a black pigment as described in Example 1. A black and white halftone positive is obtained.

EXAMPLE 8

In 100 ml methylene chloride are dissolved while stirring:
2.0 g polymethacrylic acid ethyl ester
0.65 g polyglycol hexadecyl ether
0.15 g triethylene glycol diacetate
0.1 g thioaceto-p-ethoxyanilide, 1/12
0.1 g thiopropionyl-p-ethoxyanilide, 1/15
0.1 g thiovaleryl-p-methoxyanilide, 1/16
0.5 g thiopropionyl anilide, and
0.2 g each of hexaarylbisimidazole compounds, 3/2, 3/3, 3/4, and 3/5.

This solution is coated onto a white pigmented polyester support and after drying is exposed in contact with a halftone image as described in Example 7. Subsequently, it is toned with a toner which contains a sublimable black dye. The black print thus produced is heated in contact with a polyester (polyethylene terephthalate) fabric for 1 minute to 200° C. A black halftone image on the polyester fabric is obtained.

I claim:

1. Photosensitive nonsilver reproduction element for the preparation of negative tonable images comprising a support bearing a layer of a photosensitive composition which comprises at least (1) one thermoplastic binder, (2) a photosensitive system consisting essentially of
   (a) 10 to 50% by weight, based on the total weight of solids in the photosensitive composition, of at least one thio compound of the formula:

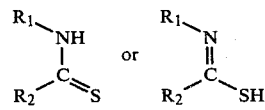

wherein $R_1$ can be H, alkyl of 1 to 4 carbon atoms and aryl of 6 to 10 carbon atoms, and $R_2$ can be H and alkyl of 1 to 6 carbon atoms, and $R_1$ and $R_2$ when taken together can be members of a 5 to 7 membered ring which may contain oxygen, sulfur and nitrogen as additional heteroatoms, and (b) at least one hexarylbisimidazole compound of the formula:

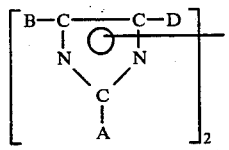

wherein A, B and D are either identical or different and are optionally substituted aryl groups derived from carbocyclic or heterocyclic compounds; and optionally (3) a plasticizer.

2. Photosensitive element according to claim 1, characterized in that the photosensitive layer contains a photosensitive system of at least one of (a) and (b), compound (a) taken from the group of thiopropionic acid anilide, 2-mercaptothiazoline, and Ω-thiocaprolactam, and compound (b) taken from the group of hexaphenylbisimidazole, 2,2'-chlorophenyl-tetraphenyl-bisimidazole, 2,2-'chlorophenyl-tetramethoxy phenylbisimidazole, and 2,2'-ethoxyphenyl-tetraphenyl-bisimidazole.

3. Photosensitive element according to claim 1 or claim 2 characterized in that the hexaarylbisimidazole compounds are present in amounts from 10 to 70% by weight based on the total weight of solids in the photosensitive composition.

4. Photosensitive element according to claim 3 characterized in that the photosensitive composition contains sterically hindered phenols.

* * * * *